United States Patent [19]

Renals

[11] Patent Number: 4,556,796
[45] Date of Patent: Dec. 3, 1985

[54] INFRARED RADIATION DETECTOR
[75] Inventor: Martin Renals, Southampton, England
[73] Assignee: U.S. Philips Corporation, New York, N.Y.
[21] Appl. No.: 619,429
[22] Filed: Jun. 11, 1984
[30] Foreign Application Priority Data Jul. 6, 1983 [GB] United Kingdom ............... 8318273

[51] Int. Cl.4 ............................................. G01J 5/00
[52] U.S. Cl. ...................................... 250/338; 250/349
[58] Field of Search .......................... 250/338, 340, 349
[56] References Cited

U.S. PATENT DOCUMENTS 3,839,640 10/1974 Rossin ................................. 250/353
3,877,308 4/1975 Taylor ................................. 250/338
4,489,238 12/1984 Baker ................................. 250/338

FOREIGN PATENT DOCUMENTS 1504283 3/1978 United Kingdom .
2102200 1/1983 United Kingdom .
2125214 2/1984 United Kingdom .

Primary Examiner—Alfred E. Smith
Assistant Examiner—Carolyn E. Fields
Attorney, Agent, or Firm—Marc D. Schechter

[57] ABSTRACT

An infrared radiation detector comprises two differentially connected pyroelectric detector elements in parallel-opposition. The detector elements are formed in a single body of pyroelectric material having two adjacent pairs of overlapping electrodes on opposite major surfaces of the body. The two detector elements are poled in the same direction. To electrically connect the top electrodes of each pair to the bottom electrodes of the other pair, each electrode is provided with an L-shaped extension. Each extension is arranged such that at an edge of the body the extension of the top electrode of one pair overlaps the extension of the bottom electrode of the other pair. The overlapping extensions can be electrically connected together by conductive epoxy or by conductive clips on the edge of the body.

20 Claims, 5 Drawing Figures

U.S. Patent  Dec. 3, 1985  4,556,796
Fig. 1.
Fig. 2.
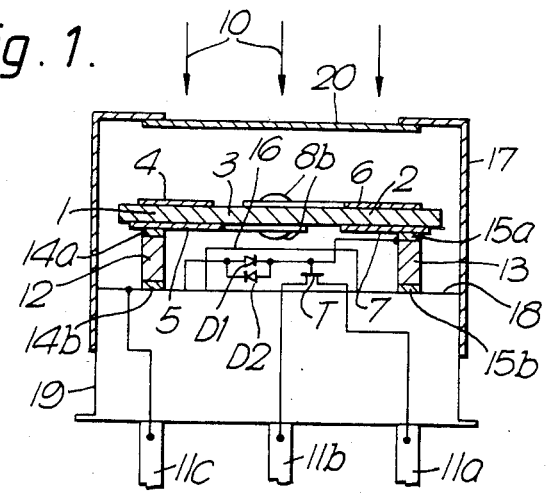
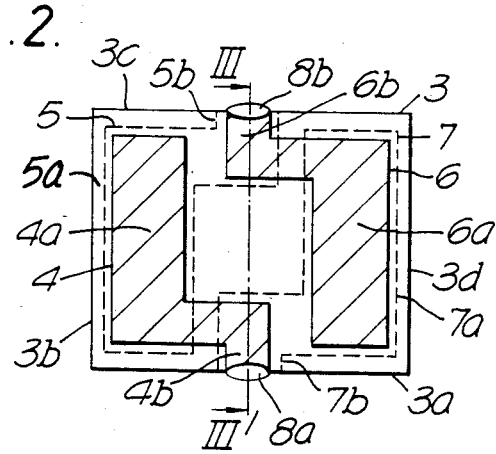
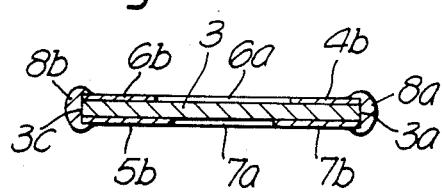
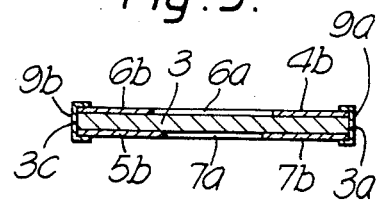
Fig. 3.
Fig. 5.
Fig. 4.

INFRARED RADIATION DETECTOR

BACKGROUND OF THE INVENTION

The invention relates to an infared radiation detector. The detector comprises a first pyroelectric detector element having first and second electrodes arranged opposite each other on first and second opposite major surfaces of a pyroelectric body. A second pyroelectric detector element has third and fourth electrodes arranged opposite each other on the first and second major surfaces.

Infrared radiation detectors comprising pyroelectric detector elements may be used for a variety of purposes. For example, they may be used in remote switching systems, in intruder alarms, and in movement sensors generally. Such sensors rely on the fact that a human being naturally provides a moving source of infrared radiation as he walks about or even as he moves only part of his body, for example by waving his hand. The radiation which he emits is converted by the pyroelectric detector into an electric signal which can be used, for example, to actuate an alarm or to switch lights on or off.

In order to provide immunity from undesired signals generated by variations in ambient temperature and background radiation, known detectors comprise two pyroelectric detector elements connected differentially. Ambient temperature changes and background radiation changes affect both elements equally, and so generate equal but opposite signals which cancel each other to give no net output signal from the detector. On the other hand, a moving source of infrared radiation provides an output signal when the two detector elements receive the radiation unequally, for example by using a focussed optical system.

It is common for the two pyroelectric detector elements to be connected electrically in series, but with opposite polarity. For example, in U.S. Pat. No. 3,839,640 two separate electrodes are provided on one side of a uniformly poled pyroelectric plastic film, and a single common electrode is present on the other side of the film opposite the first two electrodes. The common electrode floats electrically and provides the series connection between the two detector elements.

In operation, the electric potential on the floating electrode may reach very high values, especially if the detector is subject to wide temperature variations. Unfortunately, this can be a source of noise because such high potentials tend to drive current through the capacitive pyroelectric element. Also, these high potentials can cause undesired depoling of the pyroelectric material. In the case of very thin elements subjected to rapid temperature changes, there may even be an electrical discharge over the edges of the elements.

The problem of noise caused by the floating electrode can be overcome by connecting the two elements electrically in parallel, but still with opposite polarities. This arrangement generally has a better signal-to-noise ratio than an equivalent series-opposed arrangement.

A parallel-opposed arrangement may comprise two physically separate detector elements with opposite polarity. Each element comprises a piece of pyroelectric material sandwiched between a front and a rear electrode. The two front electrodes are electrically connected together, and the two rear electrodes are electrically connected together, typically with wire leads.

Compared with the series-opposed arrangement described above, the parallel-opposed arrangement has the disadvantage that the two detector elements are not formed of a single piece of pyroelectric material. Hence, it is more difficult to manufacture and assemble. In some, but not all, pyroelectric materials it is possible to make a parallel-opposed arrangement in a single piece of pyroelectric material by poling two different parts of the material in opposite directions. However, this is inconvenient and can induce stresses in the material possibly leading to device breakage.

U.S. Pat. No. 3,877,308 discloses a parallel-opposed detector arrangement. The detector has a single body of uniformly poled pyroelectric material comprising two pyroelectric detector elements. One of the detector elements has first and second opposite electrodes on opposite major surfaces of the body and the other detector element has third and fourth opposite electrodes on the same surfaces. The first electrode is connected to the fourth electrode by a conductive lead and the second electrode is connected to the third electrode by a conductive lead. Unfortunately, this structure has the disadvantage that it is difficult to connect a conductive lead such as a gold wire from an electrode on one surface of the body to an electrode on the opposite surface and, these connections cannot easily be made using conventional wire bonding techniques and apparatus. Moreover, for thin pyroelectric detector elements (that is to say elements whose thicknesses are less than 100 microns), it is even more difficult to make wire bonds because the elements are so fragile that they are prone to break under the pressure of the wire bonding operation.

SUMMARY OF THE INVENTION

According to the present invention, an infrared radiation detector comprises a first pyroelectric detector element having first and second opposite electrodes on first and second opposite major surfaces, respectively, of a pyroelectric body. A second pyroelectric detector element has third and fourth opposite electrodes on the first and second major surfaces, respectively. The first and fourth electrodes each have extended portions which overlap at an edge of the pyroelectric body and which are electrically connected together by edge connection means.

This detector has the advantage of being formed from a single body of pyroelectric material. However, in contrast with the prior art detector described above, an electrode of one detector element can be connected to the opposite electrode of a second detector element in a straightforward manner without the need for wire bonds. This facilitates the manufacture of detectors employing thin pyroelectric detector elements without risking damage when making the connection.

Moreover, the two detector elements can easily be connected in parallel without the need for wire bonds, if additionally the second and third electrodes each have extended portions which overlap at an edge of the pyroelectric body and which are electrically connected together by edge connection means. The edge connection means may be an electrically conductive epoxy, a conductive clip, or a combination of the two.

It is a straightforward matter to arrange the two detector elements to be poled in the same direction. As a result of the invention, the detectors will then be connected in a parallel-opposed arrangement.

In order to ensure that the two electrodes on one major surface of the pyroelectric body are registered with the two electrodes on the opposite major surface, it is preferable that the first and third electrodes are larger in area than the second and fourth electrodes. Also, to allow greater tolerances in connecting the electrodes on one major surface to those on the other it is preferable that at least at the edge of the pyroelectric body the extended portions of the first and third electrodes are wider than the extended portions of the fourth and second electrodes respectively.

BRIEF DESCRIPTION OF THE DRAWING

FIG. 1 is a partly schematic, partly cross-sectional view of an infrared radiation detector according to the invention.

FIG. 2 is a plan view of the detector elements of the detector in FIG. 1.

FIG. 3 is a cross-sectional view of the detector elements taken on the line III—III' of FIG. 2.

FIG. 4 is an equivalent circuit diagram of the detector element arrangement.

FIG. 5 is a cross-sectional view of the detector elements having modified edge connection means.

It should be noted that, for the sake of clarity, the Figures are not drawn to scale.

DESCRIPTION OF THE PREFERRED EMBODIMENTS

The infrared radiation detector shown in FIG. 1 comprises two pyroelectric detector elements 1 and 2. The detector elements 1 and 2 are formed from a single body 3 of pyroelectric ceramic material such as lathanum and manganese doped lead zirconate titanate. (For more information about this material, see U.K. Pat. No. 1,504,283.) The pyroelectric body 3 is for example 3.6 mm long, 2.6 mm wide and 150 microns thick.

The first pyroelectric element 1 has overlapping electrodes 4 and 5, and the second pyroelectric element 2 has overlapping electrodes 6 and 7. Electrodes 4 and 5 are arranged on opposite major surfaces of the body 3 as are electrodes 6 and 7. The electrodes 4 to 7 are made of, for example, nichrome which is substantially transparent to infrared radiation of a wavelength at which the detector is responsive. The electrodes are provide in known manner using conventional photolithographic techniques.

The electrode configuration will now be described with reference to the plan view of the detector shown in FIG. 2. In FIG. 2, the electrodes 4 and 6 on the upper major surface of the pyroelectric body 3 are cross-hatched, and the electrodes 5 and 7 on the lower major surface of the body 3 are represented by broken lines.

Each of the electrodes 4 to 7 has a major rectangular area and an L-shaped extended portion extending from the major rectangular area to an edge of the pyroelectric body. Thus, the top electrode 4 of the first detector element 1 has a major rectangular area 4a which is 2 mm long, 1 mm wide, and spaced from the edges 3a, 3b and 3c of the body 3 by approximately 0.3 mm. The electrode 4 also has adjacent the edge 3a of the body 3, an L-shaped extension 4b approximately 0.25 mm wide, contiguous with the major area 4a, and terminating midway along the edge 3a.

Similarly, the top electrode 6 of the second detector element 2 has a major rectangular area 6a which is 2 mm long, 1 mm wide, and spaced from the edges 3a, 3c, and 3d of the body 3 by approximately 0.3 mm. The major rectangular areas 4a and 6a are spaced apart by approximately 1.0 mm. Electrode 6 also has adjacent the edge 3c of the body 3, an L-shaped extension 6b approximately 0.25 mm wide, contiguous with the major area 6a and terminating midway along the edge 3c.

As shown in FIG. 2 the bottom electrodes 5 and 7 are generally larger in area than the top electrodes 4 and 6 in order to facilitate registration. Thus, the bottom electrode 5 of the first detector element 1 has a major rectangular area 5a which is 2.3 mm long and, 1.3 mm wide, and spaced apart from the edges 3a, 3b and 3c of the body 3 by approximately 0.15 mm. The electrode 5 also has adjacent the edge 3c of the body 3, an L-shaped extension 5b approximately 0.3 mm wide, contiguous with the major area 5a, and terminating midway along the edge 3c immediately below the extension 6b of electrode 6.

Similarly, the bottom electrode 7 of the second detector element has a major rectangular area 7a which 2.3 mm long, 1.3 mm wide, and spaced from the edges 3a, 3c and 3d by approximately 0.15 mm. The major rectangular areas 5a and 7a are spaced apart by approximately 0.7 mm. Electrode 7 also has adjacent the edge 3a of the body 3 an L-shaped extension 7b approximately 0.3 mm wide, contiguous with the major area 7a, and terminating midway along the edge 3a immediately below the extension 4b of electrode 4.

Before permanently connecting the electrodes to form a parallel-opposed detector arrangement, the pyroelectric body 3 is poled. Body 3 is poled by applying an electric field across the two pyroelectric detector elements while heating the body 3 to a temperature just above the transition temperature. For the pyroelectric ceramic material in question, the applied field is 20 kV/cm, the transition temperature is approximately 135° C. and the heating temperature is 140° C. The electric field is applied in the same sense across both detector elements so that they are poled in the same direction. For this poling operation the two top electrodes 4 and 6 are temporarily connected to a potential of 300 V and the two bottom electrodes are temporarily connected to ground.

After applying the electric field for approximately 10 minutes at the elevated temperature, the pyroelectric body 3 is cooled. Then the electric field and the temporary connections are removed. Permanent connections are then made between the various electrodes by applying beads 8a and 8b of conducting epoxy, for example silver-loaded epoxy, on the edges 3a, and 3c respectively, of the pyroelectric body 3. Beads 8a and 8b are applied at the areas where the electrode extensions 4b and 7b, and 5b and 6b respectively, terminate (See FIG. 3.) Epoxy bead 8a electrically connects together electrode extensions 4b and 7b, and thus connects the top electrode 4 of the first detector element 1 to the bottom electrode 7 of the second detector element 2. Epoxy bead 8b electrically connects together electrode extensions 5b and 6b, and thus connects the bottom electrode 5 of the first detector element 1 to the top electrode 6 of the second detector element 2. The equivalent circuit diagram of detector element arrangement is shown in FIG. 4. In this FIG. 4, the pyroelectric detector elements are represented as parallel plate capacitors.

FIG. 5 shows modified edge connectors in the form of U-shaped clips 9a and 9b. Chips 9a and 9b are made of, for example, gold-plated copper. The clips fit over the edges 3a and 3c respectively, of the pyroelectric body 3, and press against the respective top and bottom electrode extensions of the adjacent detector elements. The clips 9a and 9b may be secured more firmly if they are fixed with a conducting adhesive such as, for example, a conductive epoxy.

As shown in FIG. 1 the pyroelectric body 3, and hence the two detector elements 1 and 2, are supported above a header 19 by two equally tall supporting pillars 12 and 13. The header 19 is a three-lead header which may, for example, have a conventional TO-5 outline. Two of the three leads, namely leads 11a and 11b extend through the header 19 to form terminals (not shown in FIG. 1) which protrude above the upper surface 18. The third lead 11c is electrically connected to the surface 18.

The pillars 12 and 13 are electrically conductive and may be made of an electrically conductive material, or of an insulating material such as alumina with a conductive coating of, for example, gold. Pillar 12 is fastened and electrically connected to the bottom electrode 5 of the first pyroelectric element 1 and the surface 18 of header 19. The connections are made with conductive adhesives 14a and 14b at both ends so that electrode 15 (and hence also electrode 6) is electrically connected to the third lead 11c of the header via surface 18.

The upper end of pillar 13 is fastened and electrically connected to the bottom electrode 7 of the second pyroelectric element 2 by a conductive adhesive 15a. The lower end of pillar 13 is fastened to the surface 18 of header 19 by an insulating adhesive 15b. The conductive adhesive used here my be Ablebond 36/2 ® available from Ablestick Laboratories, U.S.A. The nonconductive adhesive may be a conventional epoxy adhesive.

As shown schematically in FIG. 1 the bottom electrode 7 of the second detector element 2 is connected electrically, via the pillar 13, to the gate of a field effect transistor T. Two diodes D1 and D2 (in parallel-opposition) are connected between the gate of the transistor T and the lead 11c (via surface 18) to provide a gate leakage path for the transistor T. The source and drain of the transistor T are connected to the leads 11a and 11b via the terminals (not shown) which protrude above the surface 18 as mentioned earlier.

The circuit arrangement of the transistor T and diodes D1 and D2 may be contained in an encapsulating package 16 such as a plastic-encapsulated microminiature package. Moreover, instead of using pillars 12 and 13, the terminal leads extending from such a microminiature package may be used to support the detector elements above the header 19, as described in greater detail in British patent application GB No. 2,102,200 (corresponding to U.S. Pat. No. 4,489,238) and in co-pending British patent application No. 8220816 (published as GB No. 2.125.214A).

The detector also includes a conventional cover member 17 secured to the rim of the header 19 in known manner. The envelope comprising the header 19 and the cover member 17 may be evacuated. Alternatively, the envelope may be filled with a gas such as dry nitrogen which is relatively inert with respect to the component parts of the detector contained within the envelope.

The cover member 17 has a window 20 which is transparent to the radiation 10 to be detected. Window 20 is in line with the detector elements 1 and 2 so that the transmitted radiation can impinge thereon. The pyroelectric signl generated as a result of receiving infrared radiation from a moving source such as an intruder can be detected as an output signal from the circuit arrangement described. On the other hand signals generated by ambient temperature fluctuations tend to be cancelled out by the generation of substantially equal but opposite signals in the two detector elements.

Finally, the particular embodiments and modifications described here are given merely by way of example. It will be evident that various other modifications can be made within the scope of the invention.

I claim:

1. An infrared radiation detector comprising:
   a pyroelectric body having first and second opposite major surfaces;
   first and second electrodes arranged opposite one another on the first and second major surfaces, respectively, said first and second electrodes and a portion of the pyroelectric body therebetween forming a first pyroelectric detector element; and
   third and fourth electrodes arranged opposite one another on the first and second major surfaces, respectively, said third and fourth electrodes and a portion of the pyroelectric body therebetween forming a second pyroelectric detector element; and
   characterized in that:
   the first and fourth electrodes have extended portions which overlap each other at an edge of the pyroelectric body; and
   the detector further comprises edge connection means for electrically connecting the extended portions of the first and fourth electrodes.

2. An infrared radiation detector as claimed in claim 1, characterized in that the first and second pyroelectric detector elements are poled in the same direction.

3. An infrared radiation detector as claimed in claim 2, characterized in that:
   the second and third electrodes have extended portions which overlap each other at an edge of the pyroelectric body; and
   the detector further comprises edge connection means for electrically connecting the extended portions of the second and third electrodes.

4. An infrared radiation detector as claimed in claim 3, characterized in that:
   the extended portions of the first and fourth electrodes overlap each other and are connected at a first edge of the pyroelectric body; and
   the extended portions of the second and third electrodes overlap each other and are connected at a second edge of the pyroelectric body opposite to the first edge.

5. An infrared radiation detector as claimed in claim 4, characterized in that the extended portions of the electrodes are substantially L-shaped.

6. An infrared radiation detector as claimd in claim 5, characterized in that the first and third electrodes have ares larger than areas of the second and fourth electrodes.

7. An infrared radiation detector as claimed in claim 6, characterized in that at the first edge of the pyroelectric body, the extended portion of the first electrode is wider than the extended portion of the fourth electrode.

8. An infrared radiation detector as claimed in claim 6, characterized in that at the second edge of the pyroelectric body, the extended portion of the third electrode is wider than the extended portion of the second electrode.

9. An infrared radiation detector as claimed in claim 6, characterized in that the edge connection means comprises electrically conducting epoxy.

10. An infrared radition detector as claimed in claim 6, characterized in that the edge connection means comprises an electrically conductive clip.

11. An infrared radiation detector as claimed in claim 6, characterized in that the detector further comprises an envelope in which the pyroelectric detector elements are arranged, said envelope having a window therein for transmitting radiation to be detected by the detector element.

12. An infrared radiation detector as claimed in claim 1, characterized in that:
the second and third electrodes have extended portions which overlap each other at an edge of the pyroelectric body; and
the detector further comprises edge connection means for electrically connecting the extended portions of the second and third electrodes.

13. An infrared radiation detector as claimed in claim 12, characterized in that:
the extended portions of the first and fourth electrodes overlap each other and are connected at a first edge of the pyroelectric body; and
the extended portions of the second and third electrodes overlap each other and are connected at a second edge of the pyroelectric body opposite to the first edge.

14. An infrared radiation detector as claimed in claim 13, characterized in that the extended portions of the electrodes are substantially L-shaped.

15. An infrared radiation detector as claimed in claim 14, characterized in that the first and third electrodes have areas larger than areas of the second and fourth electrodes.

16. An infrared radiation detector as claimed in claim 15, characterized in that at the first edge of the pyroelectric body, the extended portion of the first electrode is wider than the extended portion of the fourth electrode.

17. An infrared radiation detector as claimed in claim 15, characterized in that at the second edge of the pyroelectric body, the extended portion of the third electrode is wider than the extended portion of the second electrode.

18. An infrared radiation detector as claimed in claim 15, characterized in that the edge connection means comprises electrically conducting epoxy.

19. An infrared radiation detector as claimed in claim 15, characterized in that the edge connection means comprises an electrically conductive clip.

20. An infrared radiation detector as claimed in claim 15, characterized in that the detector further comprises an envelope in which the pyroelectric detector elements are arranged, said envelope having a window therein for transmitting radiation to be detected by the detector element.

* * * * *